(12) United States Patent
Kuo et al.

(10) Patent No.: US 8,026,573 B2
(45) Date of Patent: Sep. 27, 2011

(54) ELECTRICAL FUSE STRUCTURE

(75) Inventors: Chien-Li Kuo, Hsinchu (TW); Yung-Chang Lin, Tai-Chung Hsien (TW); Kuei-Sheng Wu, Tainan County (TW); San-Fu Lin, Pingtung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 352 days.

(21) Appl. No.: 12/335,510

(22) Filed: Dec. 15, 2008

(65) Prior Publication Data

US 2010/0148915 A1     Jun. 17, 2010

(51) Int. Cl.
*H01L 23/52*     (2006.01)

(52) U.S. Cl. ................ 257/529; 257/E23.149

(58) Field of Classification Search ............ 257/529, 257/E23.149, E21.592, 530, 209, 418; 337/290, 337/142, 190; 327/525
See application file for complete search history.

(56) References Cited

U.S. PATENT DOCUMENTS

| 5,936,288 | A | * | 8/1999 | Tsuchida et al. | ............ 257/370 |
| 2007/0111403 | A1 | * | 5/2007 | Jiang et al. | ............ 438/132 |
| 2008/0093703 | A1 | | 4/2008 | Yang | |
| 2008/0186788 | A1 | * | 8/2008 | Barth | ........ 365/225.7 |

OTHER PUBLICATIONS

Ng, "Complete guide to semiconductor devices", 2002, pp. 175-177.*

* cited by examiner

*Primary Examiner* — Thomas L Dickey
*Assistant Examiner* — Nikolay Yushin
(74) *Attorney, Agent, or Firm* — Winston Hsu; Scott Margo

(57) ABSTRACT

An electrical fuse structure is disclosed. The electrical fuse structure includes a fuse element disposed on surface of a semiconductor substrate, a cathode electrically connected to one end of the fuse element, and an anode electrically connected to another end of the fuse element. Specifically, a compressive stress layer is disposed on at least a portion of the fuse element.

18 Claims, 3 Drawing Sheets

ELECTRICAL FUSE STRUCTURE

BACKGROUND OF THE INVENTION

1. Field of the Invention

The invention relates to an electrical fuse structure, and more particularly, to an electrical fuse structure with improved blowing window.

2. Description of the Prior Art

As semiconductor processes become smaller and more complex, semiconductor components are influenced by impurities more easily. If a single metal link, a diode, or a MOS is broken down, the whole chip will be unusable. To treat this problem, fuses can be selectively blown for increasing the yield of IC manufacturing.

In general, fused circuits are redundant circuits of an IC. When defects are found in the circuit, fuses can be selectively blown for repairing or replacing defective circuits. In addition, fuses provide the function of programming circuits for various customized functions. Fuses are classified into two categories based on their operation: thermal fuse and electrical fuse. Thermal fuses can be cut by lasers and be linked by laser repair. An electrical fuse utilizes electro-migration for both forming open circuits and for repairing. The electrical fuse for semiconductor devices may be classified into categories of poly electrical fuse, MOS capacitor anti-fuse, diffusion fuse, contact electrical fuse, contact anti-fuse, and the like.

A blowing mechanism of conventional electrical fuse is shown in FIG. 1. The cathode of an electrical fuse structure 1 is electrically connected to the drain of the transistor as a blowing device 2 (or referred to be as a driver) and. Voltages Vfs, Vg, and Vs are applied on the anode of the electrical fuse structure 1, the gate of the transistor, and the drain of the transistor, respectively. The source of the transistor is grounded. The electric current is traveled from the anode of the electrical fuse structure 1 to the cathode of the electrical fuse structure 1; and the electrons flow from the cathode of the electrical fuse structure 1 to the anode of the electrical fuse structure 1. The electric current suitable for the blowing is in a proper range. If the electric current is too low, the electron-migration is not completed, whereas if the current is too high, the electrical fuse tends to be thermally ruptured. In general, the blowing current for an electrical fuse structure made by a 65 nm manufacturing process is about 13 mA. The blown region of an electrical fuse also varies according to the design of the product. For instance, the blown region of a contact electrical fuse typically is located in the plug disposed on the cathode region, whereas the blown region of a poly electrical fuse is located in the polysilicon layer of the fuse element.

In conventional art, a predetermined voltage is typically calculated before the fuse structure is blown by voltage values above the predetermined voltage. Unfortunately, the aforementioned poly electrical fuses are unable to be blown by voltage values above the predetermined voltage while not exceeding the predetermined voltage by a lot, which ultimately produces poor blowing window. Therefore, how to fabricate a fuse structure with improved blowing voltage range has become an important task.

SUMMARY OF THE INVENTION

It is an objective of the present invention to provide an electrical fuse structure to improve poor blowing window of the conventional fuse design.

According to a preferred embodiment of the present invention, an electrical fuse structure is disclosed. The electrical fuse structure includes a fuse element disposed on surface of a semiconductor substrate, a cathode electrically connected to one end of the fuse element, and an anode electrically connected to another end of the fuse element. Specifically, a compressive stress layer is disposed on at least a portion of the fuse element.

According to another aspect of the present invention, an electrical fuse structure is disclosed. The electrical fuse structure includes: a semiconductor substrate having a transistor region and a fuse region; a transistor disposed on the semiconductor substrate of the transistor region; a fuse element disposed on the semiconductor substrate of the fuse region; a cathode and an anode electrically connected to two ends of the fuse element; and a compressive stress layer covering the transistor of the transistor region and the fuse element, the cathode, and the anode of the fuse region.

The present invention specifically covers a compressive stress layer on the fuse element of an electrical fuse structure, in which the compressive strain from the compressive stress layer could be utilized to increase the blowing window of the fuse. Preferably, the fuse element, the cathode, and the anode of the electrical fuse structure are fabricated on surface of a semiconductor substrate, thereby forming a surface type fuse structure. The compressive strain of the compressive stress layer is preferably between −5 GPa and 0 GPa, and the compressive stress layer could be disposed to cover the entire fuse structure including the fuse element, the cathode, and the anode, or could also be disposed to cover only the fuse element or only the cathode and the anode region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
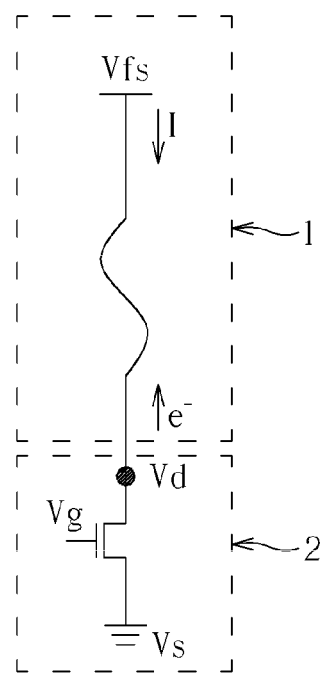
FIG. 1 illustrates a blowing mechanism of a conventional fuse structure.
Figure 2:
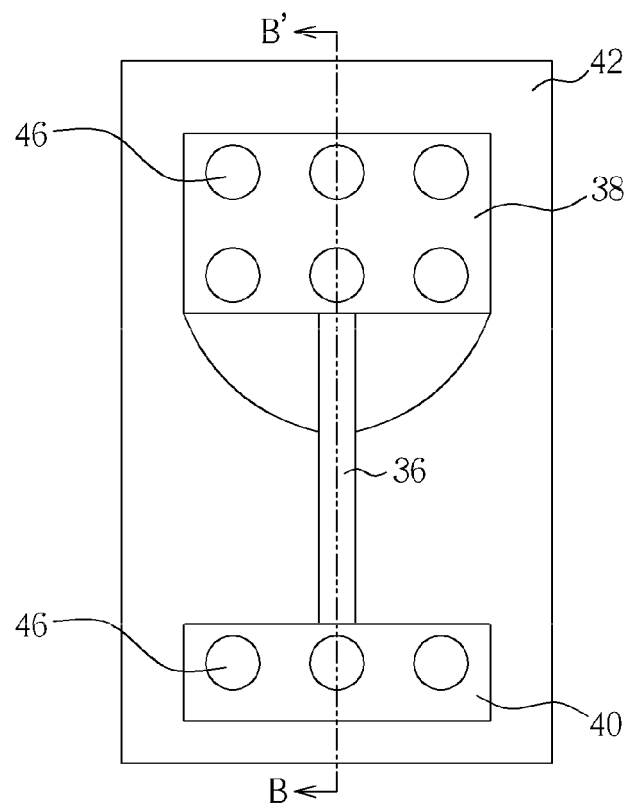
FIG. 2 illustrates a top-view of an electrical fuse structure according to a preferred embodiment of the present invention.
Figure 3:
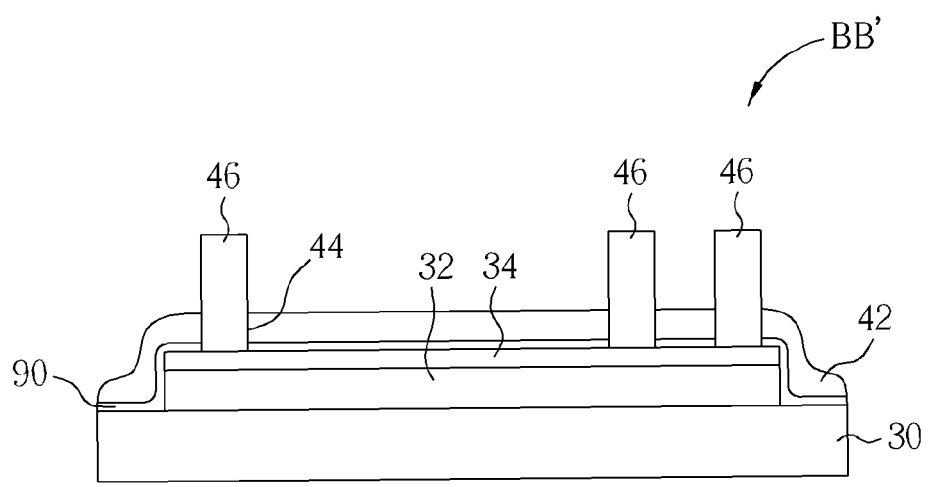
FIG. 3 illustrates a cross-sectional view of FIG. 4 along sectional line BB'.

Referring to FIGS. 2-3, FIG. 2 illustrates a top-view of an electrical fuse structure according to a preferred embodiment of the present invention, and FIG. 3 illustrates a cross-sectional view of FIG. 2 along sectional line BB'. As shown in the figures, a semiconductor substrate 30, such as a silicon substrate composed of SiCOH, $SiO_2$ or $Si_3N_4$ is provided. A fuse element 36 and an anode 38 and a cathode 40 connected to two ends of the fuse element 36 is formed on the semiconductor substrate 30. In this embodiment, the fuse element 36, the anode 38, and the cathode 40 are preferably composed of patterned polysilicon layer 32 and silicide layer 34. The patterned polysilicon layer 32 is preferably fabricated by a photo-etching process, the silicide layer 34 on the other hand is fabricated a typical salicide process. For instance, a metal layer (not shown) could be disposed on the polysilicon layer 32, and an anneal treatment is conducted to react the metal layer and the polysilicon layer 32 and un-reacted metal layer is etched away by wet etching process to form the silicide layer 34. Alternatively, the fuse element 36, the anode 38, and the cathode 40 could also include any conductive material, such as polysilicon, metal, or combination thereof. Materials used for forming the fuse element 36, the anode 38, and the cathode 40 could be of same material or different material.

A compressive stress layer 42 is then disposed on the fuse element 36, the anode 38, and the cathode 40. According to a preferred embodiment of the present invention, the compressive stress layer 42 is composed of dielectric material having compressive strain, such as silicon oxide or silicon nitride. The compressive strain of this compressive stress layer 42 is preferably between −5 GPa and 0 GPa. The stress of the compressive stress layer 42 is preferably accomplished by adjusting fabrication parameters including temperature, pressure, precursor type, or flowing rate, or by applying external treatment such as annealing process or UV irradiation. It should also be noted that in this embodiment, the compressive stress layer 42 is disposed to cover the fuse element 36, the anode 38, and the cathode 40. Alternatively, the region covered by the compressive stress layer 42 could also be adjusted according to the demand of the product. For instance, the compressive stress layer 42 could be disposed only on the anode 38 and the cathode 40 or only on the fuse element 36, which are all within the scope of the present invention. Additionally, a thin cap layer 90 composed of dielectric material such as silicon nitride could also be deposited before the formation of the compressive stress layer 42.

Next, a dielectric layer (not shown) is deposited on the compressive stress layer 42 and the semiconductor substrate 30 and a photo-etching process is performed to remove a portion of the dielectric layer and the compressive stress layer 42 for forming a plurality of contact vias 44 in the dielectric layer and the compressive stress layer 42 while exposing a portion of the anode 38 and the cathode 40. A metal selected from a group consisting of W, Al, Cu, Ta, TaN, Ti, and TiN is then deposited into the conductive vias 44 to form a plurality of conductive plugs 46 electrically connected to the anode 38 and the cathode 40. This completes an electrical fuse structure according to a preferred embodiment of the present invention.

Figure 4:
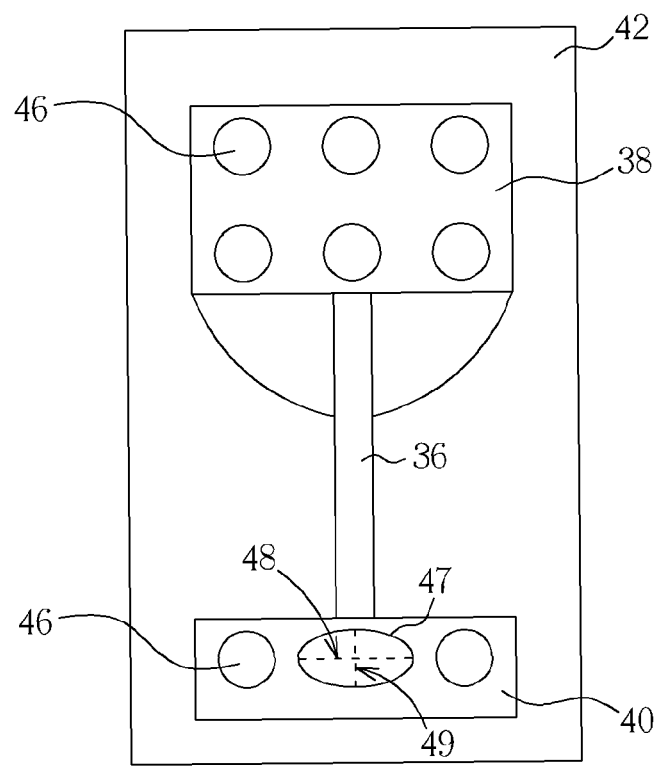
FIG. 4 illustrates a top-view of an electrical fuse structure according to an embodiment of the present invention.

It should be noted that each of the conductive plug 46 connected to the cathode 40 as shown in FIG. 2 includes a substantially circular cross-section. Alternatively, conductive plugs having different cross-section could also be formed on the cathode 40 region of the fuse structure. For instance, a conductive plug 47 having an elliptical cross-section could also be formed on the substantial central region of the cathode 40, as shown in FIG. 4. The elliptical conductive plug 47 includes a major axis 48 and a minor axis 49, in which the major axis 48 is substantially larger than twice the diameter of each circular conductive plug 46, and the minor axis 49 is substantially equal to the diameter of each circular conductive plug 46.

Figure 5:
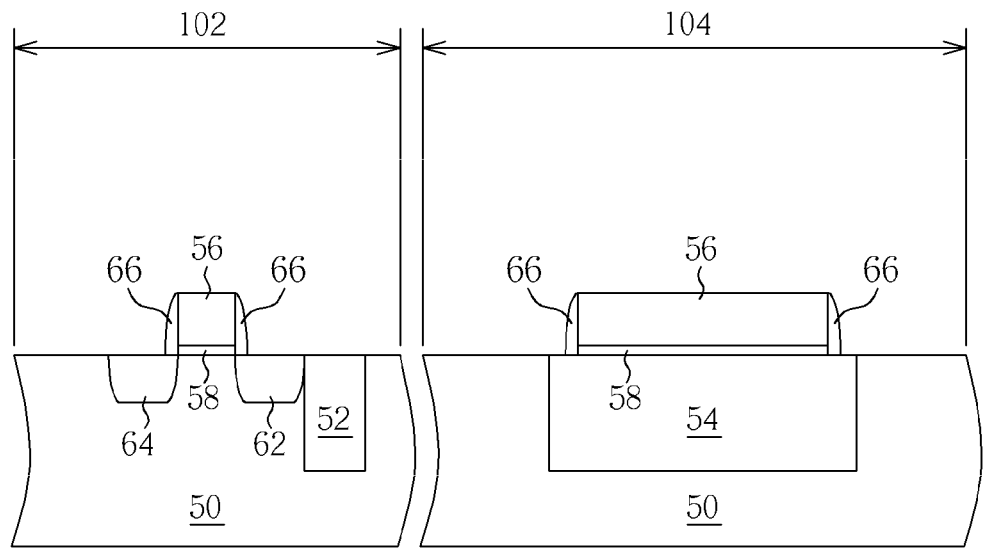
FIGS. 5-6 illustrate a method for fabricating a MOS transistor and an electrical fuse structure according to an embodiment of the present invention.
Figure 6:
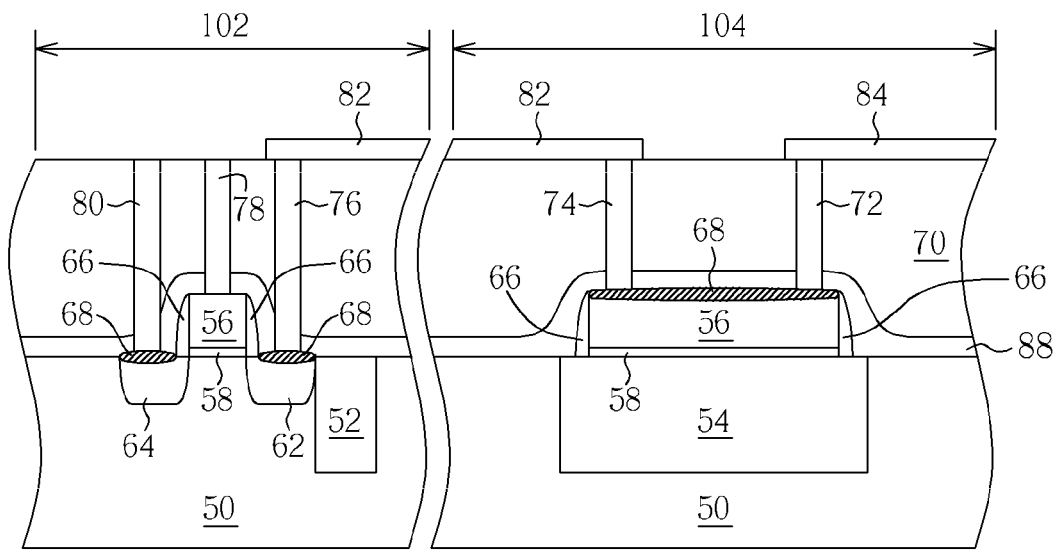

The aforementioned embodiment specifically forms an electrical fuse structure on a semiconductor substrate. Alternatively, the fabrication of the electrical fuse structure could also be integrated with fabrication of a MOS transistor, which is also within the scope of the present invention. Referring to FIGS. 5-6, FIGS. 5-6 illustrate an integrated fabrication of a MOS transistor and an electrical fuse structure according to an embodiment of the present invention. As shown in FIG. 5, a semiconductor substrate 50 is first provided. A transistor region 102 and a fuse region 104 are defined on the semiconductor substrate 50. An isolation process is conducted to form a shallow trench isolation 52 in the semiconductor substrate 50 between the transistor region 102 and the fuse region 104 and another shallow trench isolation 54 in the fuse region 104.

A dielectric layer (not shown) composed of oxide is deposited over the surface of the semiconductor substrate 50, and a gate electrode layer (not shown) preferably composed of polysilicon is formed on the dielectric layer thereafter. A photo-etching process is conducted to remove a portion of the gate electrode layer and the dielectric layer to form a gate electrode 56 and a gate dielectric layer 58 on the semiconductor substrate 50 of the transistor region 102 and a fuse pattern 60 composed of fuse element, cathode region, and anode region on the shallow trench isolation 54 of the fuse region 104. Despite the gate electrode layer in this embodiment is composed of polysilicon, the gate electrode layer could also be composed of metal or stacked structure of metal and polysilicon, which are all within the scope of the present invention.

A spacer 66 is formed on the sidewall of the gate electrode 56 and the fuse pattern 60, and an ion implantation process is conducted to form a source/drain region 62, 64 in the semiconductor substrate 50 adjacent to two sides of the spacer 66 within the transistor region 102. The present embodiment preferably forms one single spacer 66 and one source/drain region 62, 64. Alternatively, a plurality of spacers could be formed on the sidewall of the gate electrode 56 while accompanying a lightly doped drain fabrication. For instance, an offset spacer could first formed on the sidewall of the gate electrode, and a light ion implantation is performed to form a lightly doped drain adjacent to two sides of the offset spacer. A main spacer is formed around the offset spacer thereafter, and a heavy ion implantation is conducted to form a source/drain region adjacent to two sides of the main spacer. The order for forming the aforementioned offset spacer, main spacer, lightly doped drain, and source/drain region could also be adjusted according to the demand of the product, which are all within the scope of the present invention.

As shown in FIG. 6, a salicide process could be performed to form a silicide layer 68 over the surface of the fuse pattern 60 and the source/drain region 62, 64. The silicide 68 could include WSi, TiSi, CoSi, NiSi, or alloy with Pt \, but not limited thereto. This completes the fabrication of a MOS transistor in the transistor region 102. A contact etch stop layer (CESL) 88 having compressive strain is then deposited on the MOS transistor disposed in the transistor region 102 and fully or partially deposited on the fuse pattern 60 disposed in the fuse region 104. The contact etch stop layer 88 is preferably composed of silicon nitride or silicon oxide. Similar to the aforementioned embodiment, a thin cap layer composed of dielectric material could also be deposited before or after the formation of the compressive CESL 88 and the stress of the compressive CESL 88 is preferably accomplished by adjusting fabrication parameters including temperature, pressure, precursor type, or flowing rate, or by applying external treatment such as annealing process or UV irradiation. A dielectric layer 70 is formed on the contact etch stop layer 88, and a photo-etching process is conducted to remove a portion of the dielectric layer 70 and the contact etch stop layer 88 to form a plurality of contact vias while exposing a portion of the silicide layer 68 disposed on top of the gate electrode 56, the source/drain region 62, 64, and the fuse pattern 60. It should be noted that as NMOS and PMOS transistors each carrying different carriers (such as electron carriers in NMOS and hole carriers in PMOS) are commonly formed in a logic circuit region, a tensile CESL may be deposited on the NMOS transistor while compressive CESL covering the PMOS transistor. Therefore, a tensile CESL could be deposited before or after the formation of a compressive CESL, and the tensile CESL disposed on the PMOS region and the fuse region 104 is preferably removed.

A metal selected from a group consisting of W, Al, Cu, Ta, TaN, Ti, and TiN is then deposited in the contact vias to form a plurality of conductive plugs 72, 74, 76, 78, 80 in the dielectric layer 70 and contact etch stop layer 88 for electrically connecting the MOS transistor and the fuse pattern 60. Next, a metal interconnective process is performed to form metal interconnects 82 connecting conductive plugs 74 and 76 and a metal interconnect 84 connecting a plug 72 and peripheral logic circuits. The plug 74 is further connected to cathode of the fuse pattern 60, the plug 76 is connected to the source/drain region 62, and the plug 72 is connected to anode of the fuse pattern 60. This completes the integrated fabrication of a MOS transistor and an electrical fuse structure.

Overall, the present invention specifically covers a compressive stress layer on the fuse element of an electrical fuse structure, in which the compressive strain from the compressive stress layer could be utilized to increase the blowing window of the fuse. Preferably, the fuse element, the cathode, and the anode of the electrical fuse structure are fabricated on surface of a semiconductor substrate, thereby forming a surface type fuse structure. The compressive strain of the compressive stress layer is preferably between −5 GPa and 0 GPa, and the compressive stress layer could be disposed to cover the entire fuse structure including the fuse element, the cathode, and the anode, or could also be disposed to cover only the fuse element or only the cathode and the anode region.

According to another embodiment of the present invention, the compressive stress layer disposed on the fuse structure could also be the same contact etch stop layer disposed on the MOS transistor. In other word, after defining a transistor region and a fuse region on a semiconductor substrate and completing a typical MOS transistor fabrication, a contact etch stop layer having compressive strain could be formed on MOS transistor and the fuse pattern of the fuse region. A dielectric layer could be disposed on the contact etch stop layer thereafter and a plurality of contact plugs could be formed in the dielectric layer for electrically connecting the MOS transistor and the fuse pattern, thereby forming an integrated structure.

Those skilled in the art will readily observe that numerous modifications and alterations of the device and method may be made while retaining the teachings of the invention.

What is claimed is:

1. An electrical fuse structure, comprising:
    a fuse element disposed on surface of a semiconductor substrate, wherein at least a portion of the fuse element comprises a compressive stress layer thereon;
    a cathode electrically connected to one end of the fuse element; and
    an anode electrically connected to another end of the fuse element, wherein the compressive stress layer covers the cathode or the anode.

2. The electrical fuse structure of claim 1, wherein the compressive stress layer is a silicon nitride layer.

3. The electrical fuse structure of claim 1, wherein the fuse element comprises a polysilicon layer and a silicide layer.

4. The electrical fuse structure of claim 1, wherein the compressive strain of the compressive stress layer is between −5 GPa and 0 GPa.

5. The electrical fuse structure of claim 1, further comprising a plurality of conductive plugs electrically connected to the cathode and the anode through the compressive stress layer.

6. The electrical fuse structure of claim 5, wherein the conductive plugs electrically connected to the cathode comprise a plurality of circular conductive plugs and at least one elliptical conductive plug.

7. The electrical fuse structure of claim 6, wherein the elliptical conductive plug comprises a major axis and a minor axis, wherein the major axis is larger than twice the diameter of each circular conductive plug.

8. The electrical fuse structure of claim 1, further comprising a thin dielectric cap layer disposed between the fuse element and the compressive stress layer.

9. An electrical fuse structure, comprising:
    a semiconductor substrate having a transistor region and a fuse region;
    a transistor disposed on the semiconductor substrate of the transistor region;
    a fuse element disposed on the semiconductor substrate of the fuse region;
    a cathode and an anode electrically connected to two ends of the fuse element; and
    a compressive stress layer covering the transistor of the transistor region and the fuse element, the cathode, and the anode of the fuse region.

10. The electrical fuse structure of claim 9, wherein the transistor comprises a gate structure disposed on the semiconductor substrate of the transistor region.

11. The electrical fuse structure of claim 10, wherein the transistor comprises a source/drain region formed in the semiconductor substrate adjacent to two sides of the gate structure.

12. The electrical fuse structure of claim 9, wherein the compressive stress layer is a silicon nitride layer.

13. The electrical fuse structure of claim 9, wherein the fuse element comprises a polysilicon layer and a silicide layer.

14. The electrical fuse structure of claim 9, wherein the compressive strain of the compressive stress layer is between −5 GPa and 0 GPa.

15. The electrical fuse structure of claim 9, further comprising a plurality of conductive plugs electrically connected to the cathode and the anode through the compressive stress layer.

16. The electrical fuse structure of claim 15, wherein the conductive plugs electrically connected to the cathode comprise a plurality of circular conductive plugs and at least one elliptical conductive plug.

17. The electrical fuse structure of claim 16, wherein the elliptical conductive plug comprises a major axis and a minor axis, wherein the major axis is larger than twice the diameter of each circular conductive plug.

18. The electrical fuse structure of claim 9, further comprising a thin dielectric cap layer disposed between the fuse element and the compressive stress layer.

* * * * *